(12) United States Patent
Suntoloa et al.

(10) Patent No.: US 6,416,577 B1
(45) Date of Patent: Jul. 9, 2002

(54) METHOD FOR COATING INNER SURFACES OF EQUIPMENT

(75) Inventors: Tuomo Suntoloa; Markku Leskelä; Mikko Ritala, all of Espoo (FI)

(73) Assignee: ASM Microchemistry Ltd., Espo (FI)

( * ) Notice: Subject to any disclaimer, the term of this patent is extended or adjusted under 35 U.S.C. 154(b) by 0 days.

(21) Appl. No.: 09/581,020

(22) PCT Filed: Dec. 9, 1998

(86) PCT No.: PCT/FI98/00955

§ 371 (c)(1),
(2), (4) Date: Jun. 7, 2000

(87) PCT Pub. No.: WO99/29924

PCT Pub. Date: Jun. 17, 1999

(30) Foreign Application Priority Data

Dec. 9, 1997 (FI) .................................................. 974472

(51) Int. Cl.$^7$ .......................... C30B 25/02; C30B 35/00; C23C 16/00

(52) U.S. Cl. ..................... 117/88; 117/200; 427/255.28; 427/230; 118/715

(58) Field of Search .............................. 117/84, 88, 104, 117/109, 200; 427/237, 38, 255.23, 255.28, 255.7, 230; 118/723, 715

(56) References Cited

U.S. PATENT DOCUMENTS

| | | | |
|---|---|---|---|
| 4,058,430 A | | 11/1977 | Suntola et al. |
| 4,145,456 A | * | 3/1979 | Kuppers et al. ............... 427/38 |
| 4,389,973 A | | 6/1983 | Suntola et al. |
| 4,636,402 A | * | 1/1987 | Vassiliou ..................... 427/49 |
| 4,879,140 A | * | 11/1989 | Gray et al. ................... 427/38 |
| 4,975,252 A | | 12/1990 | Nishizawa et al. |
| 5,690,745 A | * | 11/1997 | Grunwald et al. .......... 118/723 |

FOREIGN PATENT DOCUMENTS

EP 0015390 A1 9/1980

OTHER PUBLICATIONS

Brownell, L. E. and E. H. Young, Process Equipment Design, John Wiley & Sons, Inc., ©1959, p. 1.*
Merriam–Webster's Collegiate Dictionary, 10th edition, Merriam–Webster, Inc., ©1998.*
Dubin et al., "Selective and Blanket Electroless Copper Deposition for Ultralarge Scale Integration," J. Electrochem. Soc., vol. 144, No. 3 (1997), pp. 898–908.
Ensinger, "Corrosion and wear protection of tube inner walls by ion beam sputter coating," Surface and Coatings Technology, vol. 86–87 (1996), pp. 438–442.
Li, "Optical Fiber Communications," Part 1, Fiber Fabrication, Academic Press, Orlando (1985), p. 363.
Poirier et al., "Ceramic Coating of Metal Tube Inner Surfaces By OMCVD," Electrochemical Society Proceedings, vol. 97–25, pp. 425–432.

(List continued on next page.)

Primary Examiner—Shrive P. Beck
Assistant Examiner—William Phillip Fletcher, III
(74) Attorney, Agent, or Firm—Knobbe Martens, Olson & Bear, LLP

(57) ABSTRACT

This invention concerns a method for coating the inner surfaces of equipment with a layer of material. According to the invention, of the inner space of the equipment limited by the surfaces to be coated is at least partly closed, to said inner space pulses of at least two different reagents in gaseous phase are fed alternately and repeatedly and a layer of material is grown on the surfaces of the inner space according to ALE-technique by exposing the surfaces to the alternating surface reactions of the reagents. With the aid of the invention it is possible to coat pipes and tanks of desired size without using a separate growing equipment.

28 Claims, 1 Drawing Sheet

OTHER PUBLICATIONS

Suntola, "Atomic layer epitaxy," Thin Solid Films, vol. 216 (1992), pp. 84–89.

Ritala et al., "Atomic Layer Epitaxy Growth of TiN Thin Films," J. Electrochem. Soc., vol. 142, No. 8, (1995), pp. 2731–2737.

Schumacher et al., "A novel mehtod for inside–coating of tubes and hollow cylinders by ion beam sputtering," Surface & Coatings Technology, vol. 89 (1997), pp. 258–261.

Ritala et al., "Perfectly Conformal TiN and AI2O3 Films Deposited by Atomic Layer Depostion," Chem. Vap. Deposition 1999, vol. 5, No. 1, pp. 7–9.

* cited by examiner

METHOD FOR COATING INNER SURFACES OF EQUIPMENT

REFERENCE TO INTERNATIONAL APPLICATION

This is the U.S. national phase under 35 U.S.C. §371 of International Application PCT/FI98/00955, filed Dec. 9, 1998.

FIELD OF THE INVENTION

The present invention relates to the coating of surfaces. In particular, the invention concerns a method for coating the inner surfaces of equipment with a layer of material.

BACKGROUND AND SUMMARY OF THE INVENTION

The purpose of coating surfaces is to improve or alter the properties of a material, such as the resistance of corrosion and stress, optical or electrical properties or to reduce friction. The material of the coating is selected by the application it is used for and by the material that is to be coated. The coatings may be metals or ceramics depending on the desired property and on the operating conditions. The motive for coating pipes and the inner surfaces of tanks is most often to improve resistance to corrosion (both chemical and abrasive corrosion) and, occasionally, to reduce friction.

Recently, new methods for coating the inner surfaces of pipes have been developed. Of the physical methods (PVD), may be mentioned ion beam sputtering, in which method a conical target material is moved inside the pipe and a sputtering ion beam is directed into the pipe from the other end of the pipe (W. Ensinger: Surface and Coatings Technology, 86/87 (1996) 438; A. Schumacher, G. Frech, G. K. Wolf: Surface and Coatings Technology, 89 (1997) 258). The method has been applied only to growing some metal and nitride films, and the dimensions of the pipe that is coated, including its length and diameter, have been only in the order of centimeters.

The other PVD-method is based on the use of plasma in the coating process (Surfcoat). With this method it is at this moment possible to coat pipes that have a diameter of 30 mm and a length of 1000 mm. The quality of the coating is approximately similar to the quality of normal plasma coating. Evaporation is one of the most common PVD-techniques.

The defect of all the PVD-methods is the limited size of the pipe that can be coated. The bending places are still a clear problem and the quality of the film is, even at its best, only of the quality that can be achieved on a plane substrate.

The inner surfaces of the pipes can also be coated electrochemically, especially with electroless plating (auto catalyst) technique. According to the method, the metal is reduced from solution chemically. This technique can be applied only to certain materials (metals and certain compounds). The advantage of this method is that the conformality may be good, as is evidenced by an example of a Cu coating with USLI-technology (V. M. Dubin et al. Journal of the Electrochemical Society 144 (1997) 898).

The chemical vapour deposition (CVD) is a known method for growing conformal thin films. Satisfactory results are obtained, when the chemical reaction functions as desired. In prior art CVD is also suggested to be used in coating the inner surfaces of pipe (L. Poirtier et al., Electrochemical Society Proceedings 97–25 (1997) 425). In general, the studied solutions comprise the coating of metal pipes with a ceramic coating and the lengths of the pipes have been in the order of a few centimeters. A known example of using CVD technique for coating inner surfaces of pipes is the manufacture of the inmost layer of the fiber, which is made by growing a layer inside a billet tube, in the manufacture of optical fiber. According to CVD method the reactant flowing through the tube is attached to the surface of the tube by heating a narrow area at a time. The hot area is thus moved forward along the tube while the tube is rotated. After growing a layer, the tube is collapsed and, thereafter, the actual pulling of the fiber can take place (T. Li: Optical Fiber Communications, part 1, Fiber fabrication, Academic Press, Orlando 1985, p. 363).

The defect of the methods described above is their lack of possibility to coat atomically accurate complicated (bended), large pipings or vessels. Likewise, each method is appropriate only for producing a film with certain constitution.

The atomically controlled production of material is known as Atomic Layer Epitaxy (ALE) method, U.S. Pat. No. 4,085,430. The production of material according to the method is performed by placing the body to be coated in a reactor where conditions enabling alternating surface reactions between the body to be coated and each necessary gaseous reagent are created [T. Suntola: Thin Solid Films 216 (1992) 84]. Typical bodies to be coated are wafers and glass substrates for the manufacture of, among other things, flat displays.

The size and shape of the ALE-reactor determine typically the size and shape of the bodies that can be coated. Since in most of the reaction solutions protective gas is used for carrying the reagents and for separating individual reaction steps, the shape of the body to be coated should be such that enables a sufficiently homogenous gas flow in the reactor.

The objective of the present invention is to remove the problems of the prior art and to provide an entirely new solution by using alternating surface reactions.

The invention is based on the idea that the inner surface of the equipment is coated by making the inner space of the body a closed, controlled gas space, the gas content of which is controlled with valve gears that are used for closing the inner space of the body. With the help of valve gears the interior of the body is alternately filled with the reagent gases required, the partial pressures of which are sufficient to saturate the reactive points of the surface. In other words, the amount of the gas molecules is as great as, or greater than the amount of the reactive sites. Thus, in each stage the reagent that is fed into the space forms an atomic layer of the material donated by the reagent onto the inner surface of the body. The density of the atomic layer is determined by the density of the reactive sites. The temperature of the inner surfaces of the body is controlled with the help of heating device placed outside the body or by feeding heat-transfer liquid or gas into the body before the coating step.

More specifically, the process according to the invention is characterised by what is stated in the characterising part of claim 1.

Considerable advantages are obtained with the aid of the invention. The method is particularly practical for coating the inner surfaces of pipes and piping and different kinds of tanks and facilities that consist of both pipes and tanks. In this invention the ALE-method is used for coating the inner surfaces of pipes and tanks without using separate growing equipment. For this reason, the size of the surface to be coated is not limited, but the method can be used to coat entire process configuration or even the whole piping of a factory. Furthermore, with present invention, the problematic areas, such as the angle parts, can be well coated. Similarly, the films can be grown on non-conductors, for which the electrical methods are known to be inapplicable.

The characteristic features and the advantages of the invention shall become apparent from the following detailed description. In the description, enclosed drawings are referred to. Of these drawings.

DETAILED DESCRIPTION OF THE PREFERRED EMBODIMENTS

Figure 1:
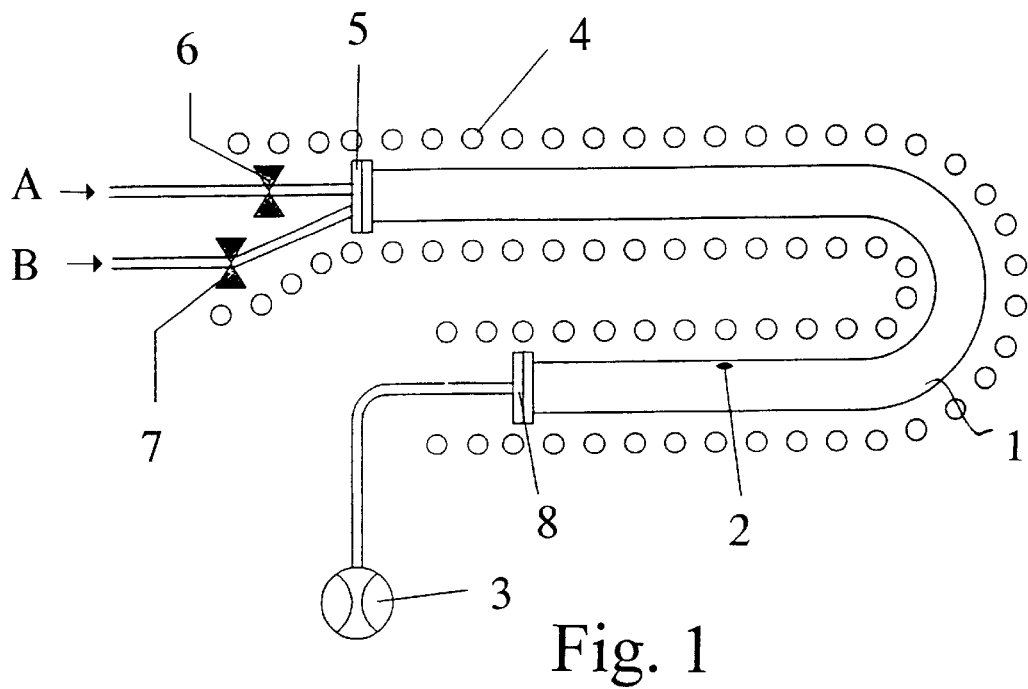
FIG. 1 presents, in schematic manner, how the invention can be applied to coating a pipe and FIG. 2 respectively presents the coating of equipment that consists of pipes and tanks.

In present invention, the ALE-technique, known as such, is used for growing corrosion section films on the inner surfaces of pipes and pipings chemically from the gas phase. In the method according to the invention, the "growing equipment" is the pipe or tank or that kind of process apparatus, that is to be coated and it is connected to the sources from where the gas pulses come. If necessary, the pipes may be heated externally to the temperature that is required by the growing reaction. The heating may be arranged by conducting heat-conveying medium such as gas or vapour. These heating methods may be connected if necessary. The external heating is of course best suited for heat-conducting constructions, such as metal piping and tanks. The use of internal heating is advantageous in solutions where the heat capacity of the pipe or equipment is rather large, thus maintaining the temperature on the course of the process.

The reaction space is thus formed by the piping or tank to be coated which is equipped with an inlet and possibly outlet collar and which is heated to the temperature required by the process. When working with a flow-through equipment, the outlet end of the equipment does not need to be closed. In the method in question, the inner space of the equipment is closed both at the inlet and the outlet end and to the tank is dosed an amount of gaseous reagent that is sufficient for total area coverage.

The actual growing of film is conducted according to the ALE-method (see, e.g., U.S. Pat. No. 4,058,430 and U.S. Pat. No. 4,389,973). According to the ALE-technique, the reagent is attached from the gas phase on the surface of the solid material in conditions where the amount of the reagent attaching to the surface is determined by the surface. The reagents are fed to the equipment alternately and separated from one another with an inert gas pulse. In a breathing equipment a precise dosing of both reagents from layer to layer to accomplish growing is possible. With a precise dosing, a carrier gas is not needed at all. The reagent is attached from the gas to a surface bond site, with which in this application is meant a site in the inner surface, which is able to react with gaseous reagent.

The films that are grown may of their composition be oxides, nitrides, chalcogenides etc., in other words, the films may be of any type of those that can be grown with ALE-technique. Typically, however, oxide and nitride films are used in corrosion protection. Similarly, the reagents are the same volatile compounds, which have been used conventionally in ALE-growing, in other words, of metals, volatile inorganic compounds (typically halogenides, metal complexes, such as carboxylates, ketonates, thiocarbamates, amido or imido complexes), metal organic compounds (alkyl compounds, cyclopentadienyl compounds etc.) and in some cases pure metals (e.g., Zn, Cd, Hg). Of non-metals the source compounds to be used for producing oxides are water, hydrogen peroxide, oxygen, ozone, alcohols and for producing nitrides ammonia or organic nitrogen compounds.

As examples of used reactions as simplified gross reactions the following may be presented:

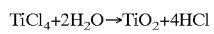
$TiCl_4 + 2H_2O \rightarrow TiO_2 + 4HCl$

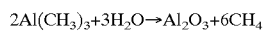
$2Al(CH_3)_3 + 3H_2O \rightarrow Al_2O_3 + 6CH_4$

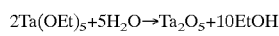
$2Ta(OEt)_5 + 5H_2O \rightarrow Ta_2O_5 + 10EtOH$

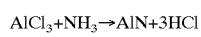
$AlCl_3 + NH_3 \rightarrow AlN + 3HCl$

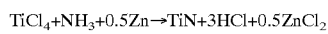
$TiCl_4 + NH_3 + 0.5Zn \rightarrow TiN + 3HCl + 0.5ZnCl_2$

The last example shows how the reaction may be enhanced with a third reagent. In the reaction in question, gaseous zinc reduces Ti(IV) to Ti(III) and helps in formation of TiN. The Zn-pulse is given after $TiCl_4$-pulse. This kind of additional reduction has been proven to be good especially in producing transition element nitrides, where the metal is in a higher oxidation level in the starting compound halogenide than in the product nitride (e.g., M. Ritala, M. Leskelä, E. Rauhala, P. Haussalo, Journal of the Electrochemical society 142 (1995) 2731).

One way of improving the endurance of the films is to use multiple film constructions. The ALE-method enables easily the manufacture of different kinds of layers in same process. By growing two different oxides, e.g., $Ta_2O_2$—$HfO_2$, $Al_2O_3$—$TiO_2$, alternatingly in layers of thickness of a couple of nanometers the insulation properties can be improved (the insulation properties correlate also with corrosion properties).

According to the first preferred embodiment presented in FIG. 1, the coating of a piping construction is conducted by a. emptying the space limited by the inner surface 2 of pipe 1 from gases that possibly disturb the coating reactions with pump 3, b. bringing surface 2 to the temperature required for the surface reactions used in the coating process with the aid of heaters 4 placed outside of body 1, c. conducting reagent A from valve 6, which is connected to pipe 1 via collar 5, to the space at least such an amount that is sufficient for occupying the surface bond sites on surface 2, d. removing the possible excess amount of reagent A via collar 8 to pump 3, e. conducting reagent B via valve 7 to the space such an amount that is sufficient for occupying the surface bond sites on surface 2, f. removing the possible excess amount of reagent B to pump 3, g. repeating steps c. to f. in cycles so many times that the coating reaches desired thickness.

As is apparent from above, the coating of the pipe is conducted mainly in the same manner as the film growing in an ALE-reactor, i.e., the reagents are fed alternately to the equipment and they flow through continuously.

Figure 2:
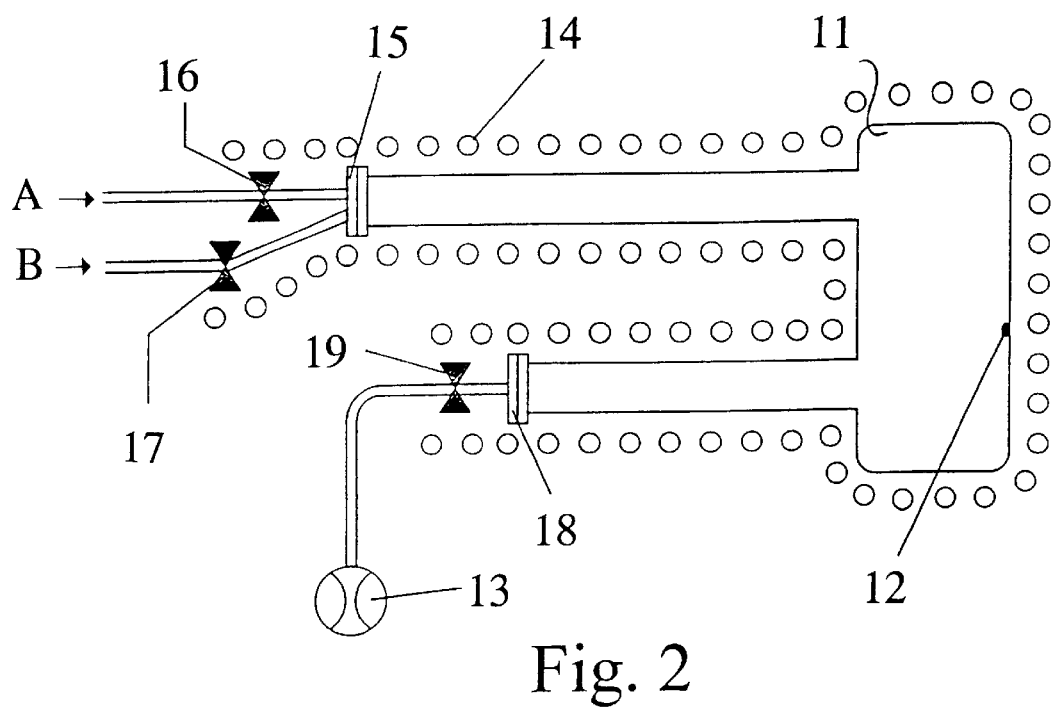

In FIG. 2 is presented an embodiment of the method for equipment which consists of pipes and tanks. Numbers 11–18 correspond to the respective parts of equipment 1–8 in previous figure. The procedure described above may also be applied to the equipment according to FIG. 2 with the difference that the gaseous reagent is dosed to tank 11 in an amount that is sufficient to achieve total coverage of the surface. The inner gas space of the tank is closed by closing valve 19 that is in the pipe between collar 18 and pump 13. Preferably, an excess amount of reagent is dosed to tank 11. The reagent is let to react with the wall of the tank for the desired reaction time and, thereafter, the tank is emptied of the gaseous reagent by opening valve 19 leading to pump 13. Thereafter, valve 19 is closed and the next reagent is fed to the tank.

According to an alternative embodiment, in the second step, the surface is brought to the temperature required for the surface reactions used in the coating process with the aid of a heat-transfer liquid or gas led to the space limited by the surface to be coated before the coating steps. If necessary, if the thermal time constant of the body is too small to maintain the temperature of the surface to be coated inside desired temperature range during the whole coating process, the second step is repeated once or more times after the cycle consisting of steps c. to f.

According to a third preferred embodiment the removal of excess reagents in steps d and f is enhanced with a flow of protective gas.

According top a fourth preferred embodiment, there are more feeding steps of reagents than steps c., d. and e., f. described above. The additional steps are used to ensure the surface reactions of the reagents or to complete them.

The following non-limiting example will clarify the invention.

EXAMPLE 1

Coating of Piping

The length of the exemplary piping is 100 m, the diameter is 50 mm. Thus the area of the inner surface that is to be coated is 100×0.157=15.7 m². The volume of the piping is approx. 0.2 m³. With a method according to the invention an $Al_2O_3$ layer with a thickness of 0.2 $\mu$m is grown on the inner surface of the piping. As reagent is used (a) trimethyl aluminum and (b) water vapour.

Prior to commencing the actual process, the cleanliness of the inner surface of the piping is checked and, if necessary, said surface is cleaned by, e.g., conducting suitable solvent through the piping. The piping is dried after possible wet washing with the aid of, e.g., gas flow and heating.

In step a. the piping is essentially evacuated of air gases and of the gases possibly detaching from the walls of the piping.

In step b. the piping is heated externally with the aid of a heating flow set around the piping at 200° C. Pumping and the flow of protective gas which may accompany pumping is continued during the heating step. Before starting the next steps, it is made sure that the partial pressures of oxygen and water vapour and other gases which may react with reagents A and B are below $10^{-3}$ mb (millibar) in the piping. To hasten the proceeding of the reagents in the piping, it is advantageous, if the total pressure of the piping is kept below 1 mb.

In step c. reagent A is conducted to the piping in vapour phase at least approx. 0.02 g.

In step d. the excess amount of reagent A is removed by pumping until the partial pressure of A in the piping is below $10^{-3}$ mb.

In step e. at least approximately 0.005 g reagent B in vapour phase is conducted to the piping.

In step f. the excess amount of reagent B is removed from the piping by pumping until the partial pressure of B in the piping is below $10^{-3}$ mb.

The steps c. to f. are repeated in cycles 2000 times.

The time needed for the heating step depends on the heating effect used and on the heat capacity of the piping. In practice, heating and pumping carried out at the same time improves the achieved cleanliness of the surface, thus making it preferable to use several hours or a couple of days for the heating and emptying step. Conducting of the steps c. to f. takes 10–100 seconds, thus, production of a coating with a thickness of 0.2 $\mu$m, takes from a couple of hours to a couple of days.

What is claimed is:

1. A method for coating the inner surfaces of equipment with a layer of material using atomic layer deposition, said method comprising:

closing at least a part of an inner space limited by the inner surfaces of the equipment;

alternately and repeatedly feeding vapor phase pulses of at least two different reagents into said inner space; and growing a layer of material on the inner surfaces of the equipment by exposing the inner surfaces of the equipment to alternating surface reactions of the reagents.

2. The method according to claim 1, further comprising the following steps in sequence:

a. emptying the space limited by the inner surfaces from gases with a pump, wherein said inner surfaces have surface bond sites;

b. bringing said inner surfaces to a temperature required for the surface reactions used in the coating process;

c. feeding a first reagent (A) to the space limited by the inner surfaces in at least an amount that is sufficient for occupying the surface bond sites on said inner surfaces;

d. removing any excess first reagent (A) from said space;

e. feeding a second reagent (B) to the space limited by the inner surfaces in at least an amount that is sufficient for occupying the surface bond sites created by the first reagent (A) on said inner surfaces;

f. removing any excess second reagent (B) from said inner space; and g. repeating steps c. to f. in sequence in cycles until the layer reaches a desired thickness.

3. The method according to claim 2, wherein the inner surfaces to be coated are brought to the temperature required for the surface reactions used in the coating process with space limited by the inner surfaces.

4. The method according to claim 2, wherein the inner surfaces to be coated are brought to the temperature required for the surface reactions used in the coating process by feeding heat-transfer liquid or gas into the space limited by the inner surfaces to be coated before steps a. to f.

5. The method according to claim 4, wherein said heat-transfer liquid or gas is fed more than once to the space limited by the inner surfaces to be coated after the cycle c. to f.

6. The method according to claim 2, further comprising flowing protective gas into the space limited by the inner surfaces in steps d and f, whereby the removal of excess amounts of reagents (A,B) is made more efficient.

7. The method according to claim 2, further comprising feeding at least one other reagent in addition to said first reagent and said second reagent to the space limited by the surfaces to be coated to facilitate the surface reactions caused by the first and the second reagent.

8. The method according to claim 1, wherein said at least a part of the inner space limited by the inner surfaces is closed with the aid of valve gears.

9. The method according to claim 8, wherein at least one of the valve gears is used in feeding the reagents.

10. The method according to claim 8, wherein at least one valve gear is used for removing excess gas.

11. The method according to claim 1, wherein the inner surface of process equipment is coated.

12. The method according to claim 1, wherein coating improves at least one of the stress, corrosion endurance optical, electrical and friction properties of the inner surface of equipment.

13. The method according to claim 1, wherein at least one layer is selected from the group consisting of an oxide layer, a nitride layer, and a chalcogenide layer is grown on the inner surface.

14. The method according to claim 1, wherein said reagents are selected from the group consisting of the inorganic compounds of metals, metalorganic compounds, pure metals, water, hydrogen peroxide, oxygen, ozone, alcohols, ammonia, and organic nitrogen compounds.

15. The method according to claim 9, wherein at least two sources of reagent are connected to said valve gear.

16. The method according to claim 11, wherein said process equipment is piping or a tank.

17. A method for coating inner surfaces of a workpiece using atomic layer deposition, comprising a plurality of cycles, wherein each cycle comprises:
   providing a workpiece defining an enclosed space having an inlet and an outlet therein;
   providing a first reagent to the enclosed space via the inlet;
   forming no more than a monolayer by providing the first reagent on the workpiece;
   removing any excess amount of the first reagent from the enclosed space via the outlet;
   providing a second reagent to the enclosed space via the inlet after removing any excess amount of the first reagent;
   allowing the second reagent to react or absorb with the monolayer from the first reagent; and
   removing any excess amount of the second reagent from the enclosed space via the outlet.

18. The method of claim 17, wherein the workpiece comprises a conduit.

19. The method of claim 17, wherein the workpiece comprises a container.

20. The method of claim 17, further comprising closing off flow through the outlet while providing the first reagent.

21. The method of claim 17, wherein the inlet and outlet define an open flow path through the enclosed space during provision of the first reagent and the second reagent.

22. The method of claim 17, wherein at least a portion of the first reagent adsorbs upon the inner surface of the workpiece, and the second reagent reacts with the portion of the first reagent adsorbed upon the inner surface.

23. The method of claim 17, further comprising externally heating the workpiece.

24. A deposition apparatus for coating only interior surfaces of a workpiece using atomic layer deposition, comprising:
   a first collar configured to seal one opening of the workpiece;
   a feed line communicating through the first collar, the feed line communicating with a gaseous source of deposition reagents, a second feed line communicating with a second gaseous source of deposition reagents, the first and second feed lines configured such that the first and second gaseous sources can be alternately and exclusively fed into the work piece;
   a second collar configured to seal another opening of the workpiece; and
   an exhaust line communicating through the second collar.

25. The apparatus of claim 24, further comprising a heat source for externally heating the workpiece.

26. The apparatus of claim 24, further comprising a valve along the exhaust line for selectively closing exhaust flow.

27. The apparatus of claim 24, further comprising a second feed line communicating a second gaseous source of deposition reactants.

28. The apparatus of claim 24, wherein the exhaust line extends from the second collar to a pump.

* * * * *

UNITED STATES PATENT AND TRADEMARK OFFICE
CERTIFICATE OF CORRECTION

PATENT NO. : 6,416,577 B1  Page 1 of 1
DATED : July 9, 2002
INVENTOR(S) : Suntola et al.

It is certified that error appears in the above-identified patent and that said Letters Patent is hereby corrected as shown below:

<u>Title page,</u>
Item [12], change "Suntoloa et al." to -- Suntola et al. --.
Item [75], change "Tuomo Suntoloa" to -- Tuomo Suntola --.

Signed and Sealed this

Seventeenth Day of September, 2002

Attest:

Attesting Officer

JAMES E. ROGAN
*Director of the United States Patent and Trademark Office*